United States Patent [19]
Okajima

[11] Patent Number: 5,526,303
[45] Date of Patent: Jun. 11, 1996

[54] SEMICONDUCTOR MEMORY DEVICE HAVING SRAM CELLS

[75] Inventor: Yoshinori Okajima, Kawasaki, Japan

[73] Assignee: Fujitsu Limited, Kawasaki, Japan

[21] Appl. No.: 159,469

[22] Filed: Nov. 30, 1993

[30] Foreign Application Priority Data

Nov. 30, 1992 [JP] Japan ..................... 4-320237

[51] Int. Cl.⁶ .................................. G11C 11/00
[52] U.S. Cl. .................. 365/154; 365/156; 365/51; 257/903
[58] Field of Search .................. 365/51, 154, 156, 365/190; 257/393, 903, 369

[56] References Cited

U.S. PATENT DOCUMENTS

| | | | |
|---|---|---|---|
| 4,541,006 | 9/1985 | Ariizumi et al. | 357/41 |
| 5,134,581 | 7/1992 | Ishibashi et al. | 365/181 |
| 5,241,495 | 8/1993 | Sasaki | 365/51 |
| 5,377,140 | 12/1994 | Usuki | 365/154 |

*Primary Examiner*—David C. Nelms
*Assistant Examiner*—Huan Hoang
*Attorney, Agent, or Firm*—Staas & Halsey

[57] ABSTRACT

The semiconductor memory device of the present invention relates to an SRAM, is object to secure a saturation drain current of a driver transistor large enough for a saturation drain current of a transfer transistor while keeping the area occupied by a memory cell within a predetermined range, and has a memory cell comprising a strip-shaped word line which includes a gate electrode of a first transistor, extends in a definite direction on a semiconductor substrate, and bends diagonally to the definite direction and widens at a first transistor region; an active region which has source/drain regions of the first transistor and intersects the word line which is formed between the source/drain regions.

10 Claims, 6 Drawing Sheets

5,526,303

SEMICONDUCTOR MEMORY DEVICE HAVING SRAM CELLS

BACKGROUND OF THE INVENTION

1. Field of the Invention

The present invention relates to a semiconductor memory device, particularly to an SRAM (static random access memory).

2. Description of the Related Art

The memory cell of the above SRAM constitutes a flip-flop circuit and comprises a driver transistor for holding data and a transfer transistor for selectively receiving a read current from a bit line.

To perform normal read/write, it is necessary to adequately secure the ratio of a saturation drain current of a driver transistor to a saturation drain current of a transfer transistor (β ratio) shown by the following expression.

$$\beta\ \text{ratio} = \beta(\text{driver})/\beta(\text{transfer}) \div IDS(\text{driver})/IDS(\text{transfer})$$

For example, β ratio is set to 3 to 4. The β ratio is secured by making β(transfer) smaller than β(driver).

To secure the β ratio, the following device design is performed. The saturation drain current is expressed as shown below.

$$IDS \propto \text{channel width}/\text{channel length}$$

Therefore, the β ratio is approximately expressed as follows:

$$\begin{aligned}\beta\ \text{ratio} &\approx IDS(\text{driver})/IDS(\text{transfer}) \\ &= Wd/Ld \times Lt/Wt\end{aligned}$$

Wt: channel width of transfer transistor
LT: channel length of transfer transistor
Wd: channel width of driver transistor
Ld: channel length of driver transistor Therefore, to secure the β ratio at 3 to 4, the channel length of the transfer transistor is equalized and the channel width of the transfer transistor is set to ⅓ to ¼ the channel width of the driver transistor. This is because the area occupied by the memory cell increases when the channel length of the transfer transistor is increased.

FIG. 1 is a top view for explaining a pattern layout of an SRAM having a memory cell comprising an transfer transistor, driver transistor, and load element according to the related art. In FIG. 1, an active region of the transfer transistor, an active region of the driver transistor, and a word line (hereinafter referred to as WL) made of a polycrystal-silicon film patterned like a strip are illustrated but a load element, a power supply line, and a bit line (hereafter referred to as BL) are not illustrated.

In FIG. 1, WL1 is a first branch word line which is made of a strip-shaped polycrystal-silicon film extending in a definite direction. WL2 is a second branch word line which is arranged in approximately parallel with the WL1 by keeping a certain interval from the WL1. And, a first active region 1a and a second active region, 1b are arranged in a region between the WL1 and WL2. The WL1 and WL2 are connected each other in a not-illustrated region to serve as a common WL in the memory cell.

Symbol 1a is a strip-shaped first active region formed in a semiconductor substrate, having a region perpendicular to the WL1 and a region, arranged between the WL1 and WL2, parallel with the WL1 and WL2. The WL1 perpendicular to the first active region 1a serves as a gate electrode of a first transfer transistor T7. Symbol 1b is a strip-shaped second active region formed in the semiconductor substrate, having a region perpendicular to the WL2 and a region, arranged between the WL1 and WL2, parallel with the WL1 and WL2. The WL2 perpendicular to the second active region 1b serves as a gate electrode of a second transfer transistor T9.

Symbol 2a is a first gate electrode of a first driver transistor T8, which is arranged to perpendicularly intersect the first active region 1a arranged in parallel with the WL1 and WL2. The other end of the first gate electrode 2a is connected to the second active region 1b. Symbol 2b is a second gate electrode of a second driver transistor T10, which is arranged to perpendicularly intersect the second active region 1b. The other end of the second gate electrode 2b is connected to the first active region 1a.

Moreover, details of the above arrangement are described below. That is, a region including both the WL1 and the first active region 1a perpendicular to the WL1 corresponds to T7 and a region including both the first gate electrode 2a and the first active region 1a perpendicular to the first gate electrode 2a corresponds to T8. An opposite conductivity-type impurity is introduced into the semiconductor substrate of the first active region 1a at the both sides of the WL1 and at the both sides of the first gate electrode 2a to form two sets of source/drain regions (hereinafter referred to as S/D region.). Moreover, the semiconductor substrates under the WL1 and first gate electrode 2a serve as channel regions of T7 and T8 respectively.

A region including both the WL2 and the second active region 1b perpendicular to the WL2 corresponds to T9 and a region including both the second electrode 2b and the second active region 1b perpendicular to the second gate electrode 2b corresponds to T10. An opposite conductivity-type impurity is introduced into the semiconductor substrate of the second active region 1b at the both sides of the WL2 and at the both sides of the second gate electrode 2b to form two sets of the S/D regions. The semiconductor substrates under the WL2 and second gate electrode 2b serve as channel regions of T9 and T10 respectively.

However, when T8 and T10 are made finer in order to advance the integration level of an SRAM, it is necessary to decrease the channel widths of T7 and T9 in accordance with the decrease of T8 and T10 in size in order to secure the above β ratio. However, there comes such a problem that it is difficult to stably form the channels because of the narrow channel effect.

To solve the problem, it is necessary to increase the channel lengths of T7 and T9. However, there arises such a problem that an area for forming a memory cell increases and the integration level cannot be advanced.

SUMMARY OF THE INVENTION

It is an object of the present invention to provide a semiconductor device capable of securing the saturation drain current of a driver transistor large enough for the saturation drain current of a transfer transistor while keeping the area occupied by a memory cell within a predetermined range.

For the semiconductor device of the present invention, firstly, an active region and the word line intersect, the word line at the intersecting portion which serves as a gate electrode of the first transistor is wider than in other regions, and the active region at the both sides of the word line at the intersecting portion serves as source/drain regions of the first transistor.

Therefore, an width of the word line along a direction in which the active region extends corresponds to a channel length of the first transistor, whereby a channel length becomes wider and a desired β ratio is secured.

Moreover, the word line in the intersecting region bends diagonally to the definite direction, whereby the width of the word line increases only in a definite direction even if the width of the word line at the bent portion is increased. Therefore, this does not affect the positional relation in the longitudinal direction between the word line and other elements. Moreover, the increase of the word line width in the definite direction increases only the transverse width of a concave or convex portion at the bent portion of the word line. This does not affect the positional relation in the longitudinal direction between the word line and other elements. Therefore, it is possible to increase the channel length and secure a desired β ratio without changing the positional relation between the word line and other elements.

Moreover, when making a pattern finer, it is possible to secure a desired β ratio by decreasing the channel width of the first transistor without decreasing the channel width of the second transistor upon locally narrowing the active region in the intersecting region in addition to increasing the channel length as described above.

Secondly, a first word line extending in a definite direction bends diagonally to the definite direction in the first transistor (transfer transistor) region, a second word line extending in a definite direction bends diagonally to the definite direction in the a third transistor (transfer transistor) region, and both first and second active regions are formed diagonally to the definite direction and intersect the first and second word lines in the transistor region.

Therefore, by increasing the widths of the first and second word lines, the length of the intersecting region, that is, the channel length of each of the first and third transistors is increased.

Moreover, because the first and second word lines in the intersecting region are arranged diagonally, the width of each of the first and second word lines increases only in a definite direction when increasing the width of each of the first and second word lines.

Therefore, this does not affect the longitudinal dimension of the memory cell unlike an embodiment according to the related art. Moreover, the increase of the width of each of the first and second word lines in the definite direction increases only the transverse width of a concave or convex portion at the bent portion of each of the first and second word lines. This does not affect the transverse dimension of the memory cell. Therefore, it is possible to increase the channel length and secure a desired β ratio while keeping the area occupied by one memory cell approximately equally to the existing one.

Moreover, in the case of further decreasing the size of a memory cell, it is possible to secure a desired β ratio by decreasing the channel width of each of the first and third transistors without decreasing the channel width of each of the second and fourth transistors upon locally narrowing the first and second active regions in the intersecting region in addition that increasing the channel length as described above.

Furthermore, it is simplified to arrange the patterns of a memory cell so that they are point-symmetric around an axis vertical to the central portion of a memory cell by arranging a first opening for connecting the source of a second transistor (driver transistor) with a first power supply line and a second opening for connecting the source of a fourth transistor (driver transistor) with the first power supply line in the central portion of the memory cell. Therefore, when decreasing the size of a memory cell, the design is also simplified.

Furthermore, it is possible to further advance the integration level by having each of the second and third power supply lines for common use between adjacent memory cells.

When first and second load elements comprising a field effect transistor respectively are used as first and second loads, the range for adjusting the channel lengths of the first and second load elements is widened by bending first and second active layers in a region intersecting a gate electrode. Therefore, the current control range is widened. Thereby, when decreasing the size of a memory cell, the design is simplified.

Furthermore, when the first and second resistors are used as the first and second loads respectively, it is possible to change the lengths of the resistors correspondingly to an area where first and second active layers are arranged by making the first and second resistors bend. Therefore, the range for adjusting the load resistance value is widened and resultingly the current control range is widened. Thereby, when decreasing the size of a memory cell, the design is simplified.

BRIEF DESCRIPTION OF THE DRAWING

DESCRIPTION OF THE PREFERRED EMBODIMENT (1) Circuit Constitution of Memory Cell of SRAM FIG. 6A shows a circuit constitution of a memory cell of the SRAM of an embodiment of the present invention using a field effect transistor as loads L1 and L2 of a driver transistor respectively. T2, T4, T5 and T6 constitute a flip-flop circuit. T1 and T3 connect the flip flop to bit lines BL1 and BL2 to perform read or write operations through the bit lines. The gate electrode of T1 and T3 are connected to word lines WL1 and WL2 respectively. The voltage potentials of WL1 and WL2 are the same so that they can both be connected to WL as shown.

In FIG. 6A, T1 and T3 serve as a first transfer transistor (first transistor) and a second transfer transistor (third transistor) respectively, and the drain of T1 and that of T3 are connected to the first bit line BL1 and the second bit line BL2 respectively.

T2 and T4 serve as a first driver transistor (second transistor) and a second driver transistor (fourth transistor) respectively, T5 and T6 serve as a first load element L1 and a second load element L2 each of which comprises an insulated gate field effect transistor respectively, and T2 and T5 and T4 and T6 are connected in series each other.

That is, the drain of T2 and that of T4 are connected to the drain of T5 and that of T6 respectively and the gate of T2 and that of T4 are connected to the gate of T5 and that of T6 respectively. The source of T1 is connected to a first connective section connecting the drain of T2 and the drain of T5 and the source of T3 is connected to a second connective section connecting the drain of T4 and the drain of T6. A gate common to both T4 and T6 is connected to the first connective section and a gate common to both T2 and T5 is connected to the second connective section.

Moreover, a first branch word line (first word line) WL1 is connected to the gate of T1 and a second branch word line (second word line) WL2 is connected to the gate of T3, and the both lines are connected to a common word line WL. A first branch power-supply line (second power supply line) Vcc1 is connected to the source of T5 and a second branch power-supply line (third power supply line) Vcc2 is connected to the source of T6, and the both lines Vcc1 and Vcc2 are connected to a second power-supply line Vcc. Moreover, the source of T2 and that of T4 are connected to a first power-supply line Vss.

For the above SRAM, the $\beta$ ratio between T1 and T2 and that between T3 and T4 are shown by the following expression.

$$\beta \text{ ratio} = \beta(\text{driver})/\beta(\text{transfer}) \div IDS(\text{driver})/IDS(\text{transfer})$$

And the value of the $\beta$ ratio ranges from 3 to 4.

The above embodiment uses load elements T5 and T6 as the loads of the driver transistors T2 and T4. However, it is also possible to use a load resistance instead of a load element as shown in FIG. 6B.

Figure 1:
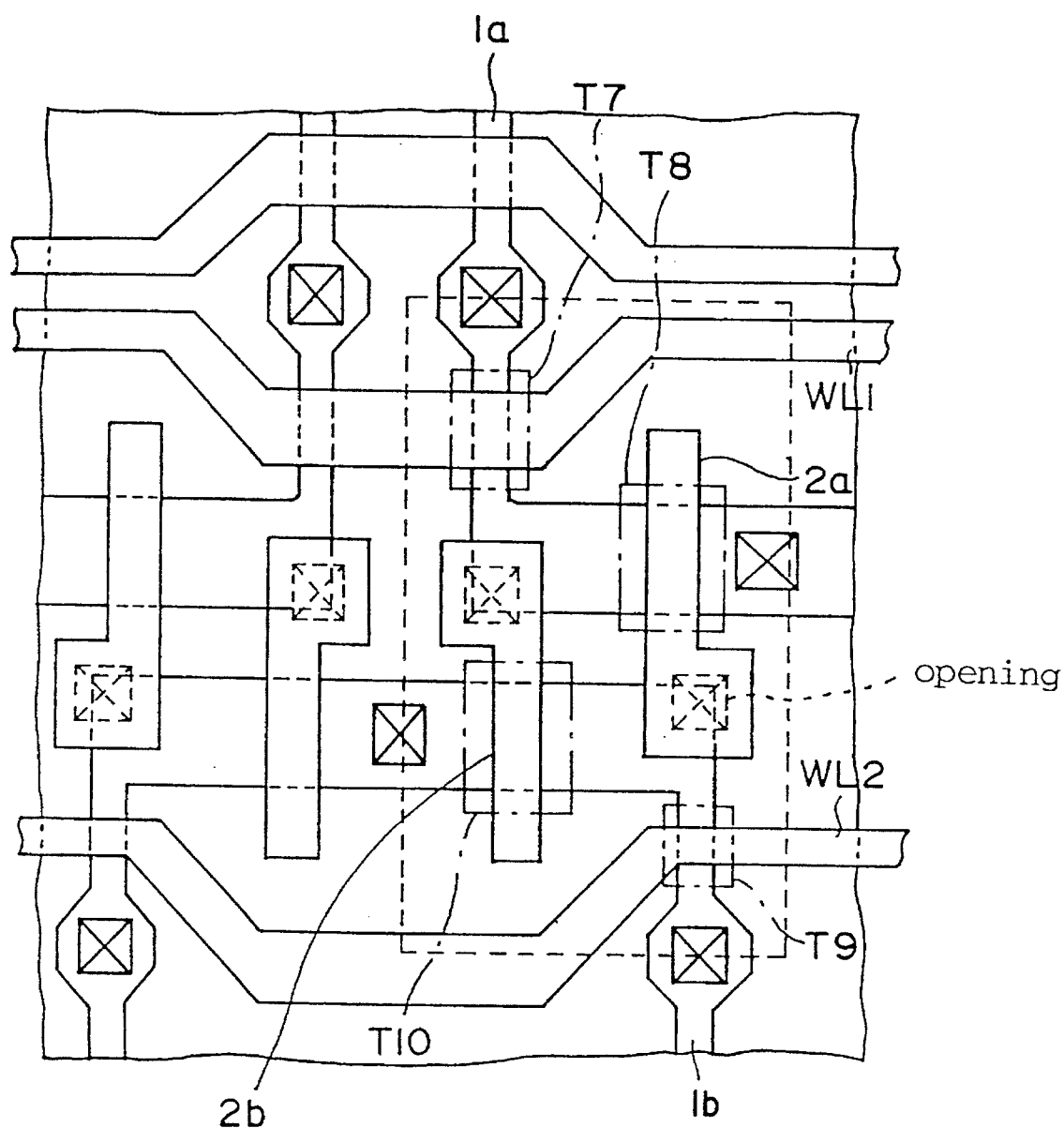
FIG. 1 shows a top view of a memory cell of an SRAM according to the related art.
Figure 2:
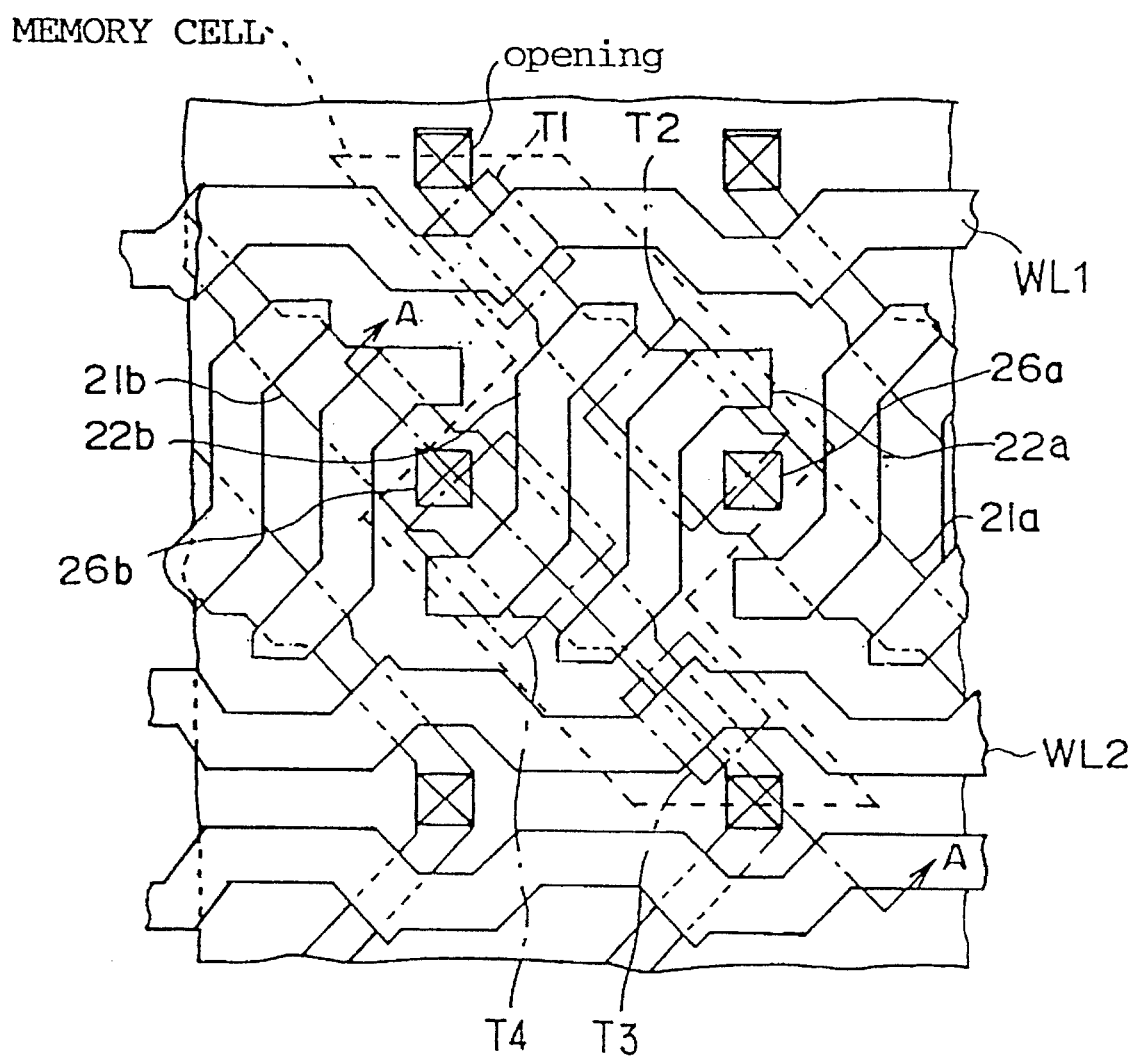
FIG. 2 shows a top view of the layout of active regions with channel regions and source/drain regions formed, strip-shaped word lines, and gate electrodes of both transfer and driver transistors of a memory cell of the SRAM of an embodiment of the present invention.
Figure 3:
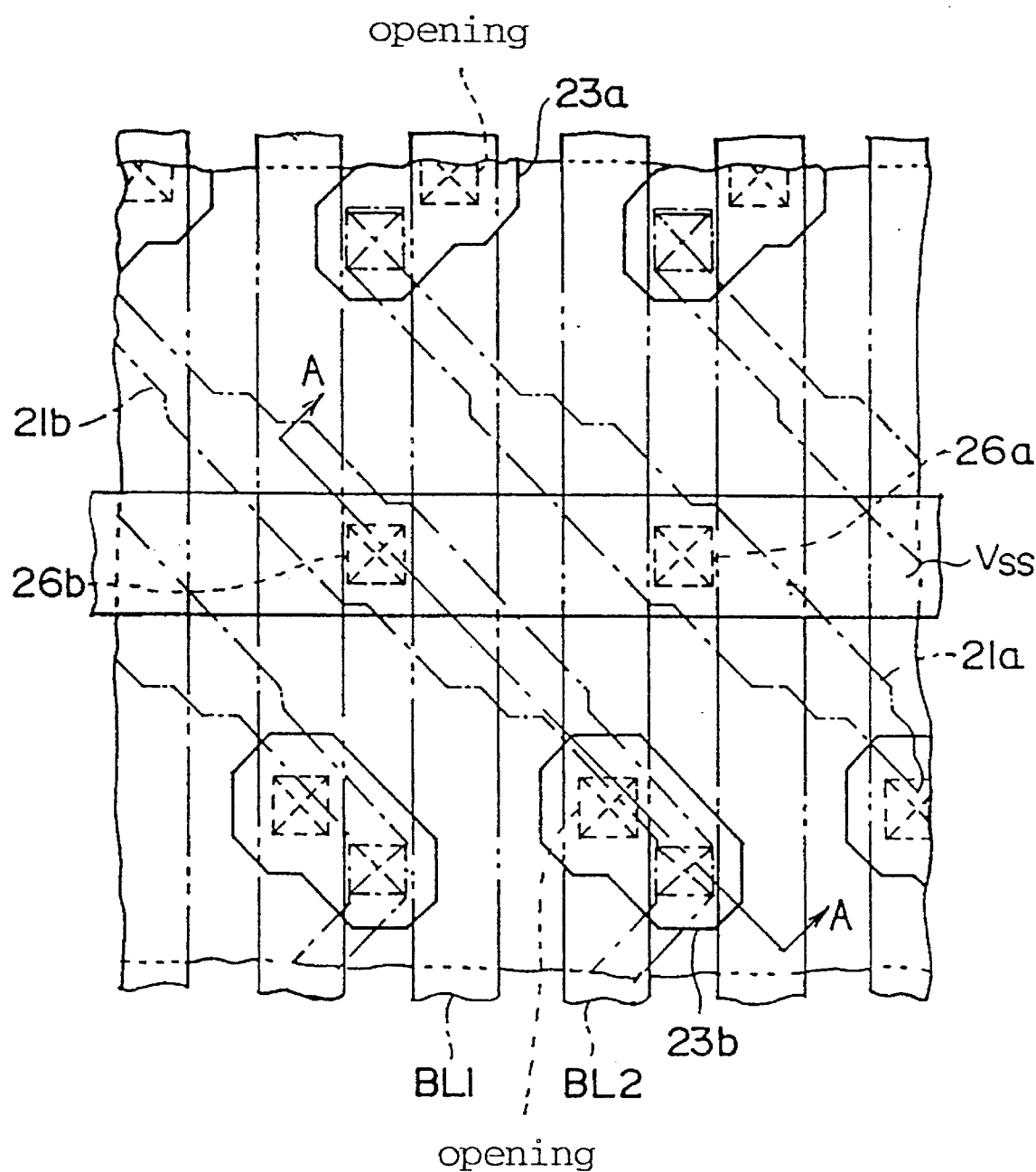
FIG. 3 shows a top view of the layout of each connective section connecting a first power supply line and each bit line and thier bit lines of a memory cell of the SRAM of the embodiment of the present invention.
Figure 4:
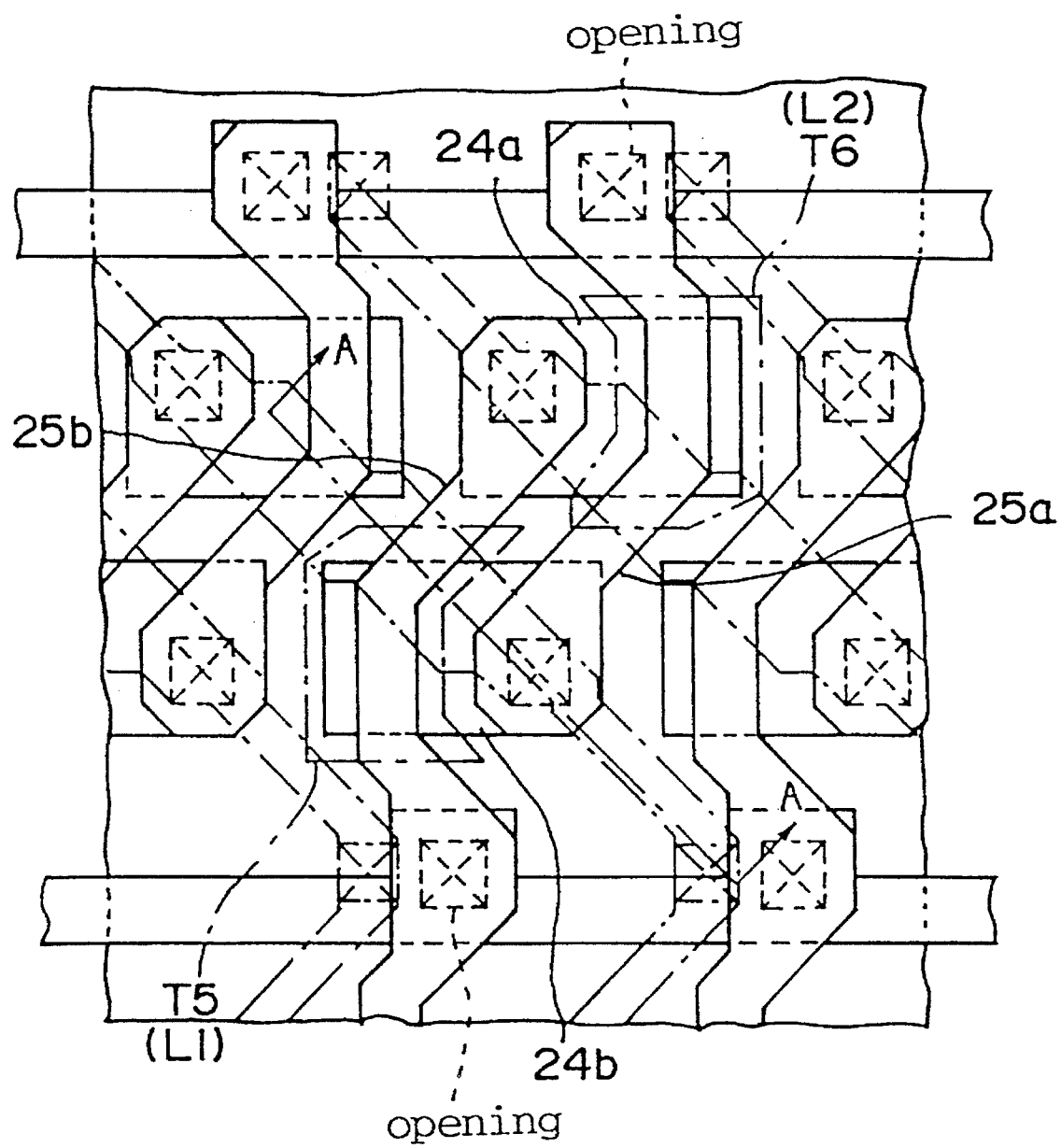
FIG. 4 shows a top view of the layout of a first load element, second load element, and second power supply line of a memory cell of the SRAM of the embodiment of the present invention.
Figure 5:
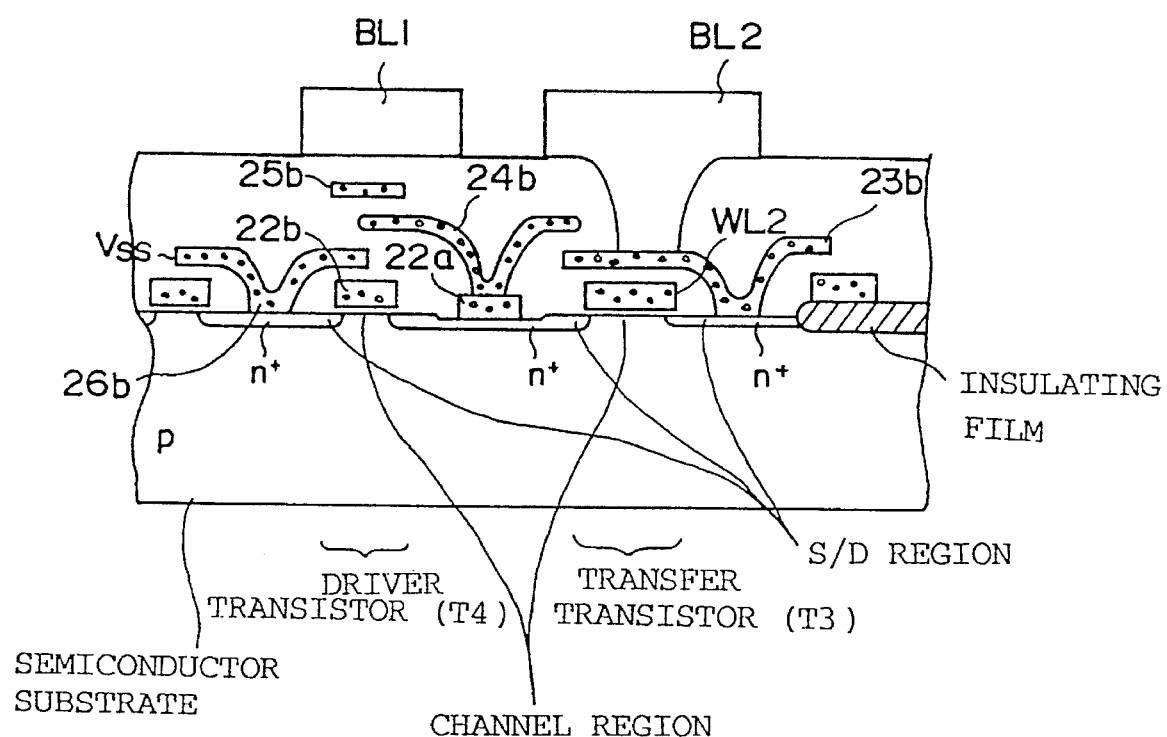
FIG. 5 shows a sectional view of the memory cell of the SRAM of the embodiment of the present invention when the pattern layouts in FIGS. 2 to 4 are superimposed, taken along the line A—A in FIGS. 2 to 4.

(2) Description of pattern layout of SRAM of embodiment of present invention having point-symmetric memory cell FIGS. 2 to 4 are top views of pattern layouts of an SRAM cell of the embodiment of the present invention having a point-symmetric memory cell comprising a transfer transistor, driver transistor, and load element. Each of the layer patterns shown in FIGS. 2 to 4 is put one over another to form a memory cell of the SRAM. FIG. 5 is a sectional view of the memory cell made by piling the layers in FIGS. 2 to 4, taken along the line A—A in FIGS. 2 to 4.

The point-symmetric layout is defined as an layout same as the original layout obtained by rotating the patterns of the original layout by 180° around an vertical axis passing through the central portion of a memory cell.

(a) Description of layout of active regions of transfer and driver transistors, word lines (hereafter referred to as WL), and gate electrodes FIG. 2 is a top view of the layout of active regions with channel regions and source/drain regions of transfer and driver transistors formed, strip-shaped word lines, and gate electrodes.

In FIG. 2, WL1 is a first branch word line which is made of a strip-shaped polycrystal silicon film extending in a definite direction (called a wiring direction). WL2 is a second branch word line made of a polycrystal silicon film, which keeps a certain interval from the WL1 and is arranged in approximately parallel with the WL1. Moreover, a first active region 21a and a second active region 21b are arranged between the WL1 and WL2. Furthermore, portions serving as the gate electrode of T1 and that of T3 are arranged diagonally to the wiring direction of WL1, for example, in the direction of 45° and the widths of the polycrystal silicon films of the portions are wider than those of the other portions in order to increase channel lengths.

The WL1 and WL2 are connected each other in not-illustrated other region to serve as a WL common to memory cells.

Symbol 21a is a strip-shaped first active region formed in a semiconductor substrate, which is arranged diagonally to the wiring direction of the WL1, for example, in the direction of 45° in such a manner that passing through both the inner region between the WL1 and WL2 and the outer regions. The first active region 21a intersects the WL1 at a portion serving as the gate electrode of T1.

Symbol 21b is a strip-shaped second active region which is adjacent to the first active region 21a, which is arranged diagonally to the wiring direction of the WL1, for example, in the direction of 45° in such a manner that passing through both the inner region between the WL1 and WL2 and the outer regions. The second active region 21b intersects the WL2 at a portion serving as the gate electrode of T3.

To secure the $\beta$ ratio, the width of the first active region 21a in the region intersecting the WL1 and that of the second active region 21b in the region intersecting the WL2 are locally narrowed so that the channel widths of T1 and T3 decrease.

However, the width of the first active region 21a in the region intersecting the first gate electrode 22a and that of the second active region 21b in the region intersecting the second gate electrode 22b are widened so that the channel widths of T2 and T4 increase.

Symbol 26a is an opening formed through an insulating film on the S/D region of T2 which is formed in the first active region 21a. The first power-supply line Vss is connected to the S/D region of T2 through the opening 26a.

Symbol 26b is an opening formed through an insulating film on the S/D region of T4 which is formed in the second active region 21b. The first power-supply line Vss is connected to the S/D region of T4 through the opening 26b.

Symbol 22a is a first gate electrode of T2 intersecting the first active region 21a, in which at least a portion serving as the gate electrode of T2 is arranged diagonally to the wiring direction of the WL1 so that an area occupied by a memory cell can be kept within the range of the predetermined area. Moreover, the other end of the first gate electrode 22a is connected with the second active region 21b.

Symbol 22b is a second gate electrode of T4 intersecting the second active region 21b, in which at least a portion serving as the gate electrode of T4 is arranged diagonally to the wiring direction of the WL1 so that an area occupied by a memory cell can be kept within the range of the predetermined area. Furthermore, the other end of the second gate electrode 22b is connected with the first active region 21a.

The above layout is further described below in detail.

A region including both the WL1 of the gate section and the first active region 21a intersecting the WL1 corresponds to T1 and a region including both the first gate electrode 22a and the first active region 21a intersecting the first gate electrode 22a corresponds to T2. And, an opposite conductivity-type impurity is introduced into the semiconductor substrate in the first active region 21a at the both sides of the WL1 of the gate section and that in the first active region 21a at the both sides of the first gate electrode 22a to form a set of the source/drain regions (S/D region) of T1 and a set of the S/D regions of T2 respectively.

The semiconductor substrate under the WL1 of the gate section and that under the first gate electrode 22a serve as a channel region of T1 and that of T2 respectively.

A region including both the WL2 of the gate section and the second active region 21b intersecting the WL2 corresponds to T3. A region including both the second gate electrode 22b and the second active region 21b intersecting the second gate electrode 22b corresponds to T4. An opposite conductivity-type impurity is introduced into the semiconductor substrate in the second active region 21b at the both sides of the WL2 of the gate section and that in the second active region 21b at the both sides of the gate electrode 22b to form a set of the S/D region of T3 and a set of the S/D region of T4 respectively. The semiconductor substrate under the WL2 and that under the second gate electrode 22b serve as a channel region of T3 and that of T4 respectively.

Besides, the WL1, WL2, first gate electrode 22a, and second gate electrode 22b are obtained by patterning a polycrystal silicon film formed simultaneously. For the dimensional design of the above pattern, there is the following relational expression.

$$\beta \text{ ratio} \div IDS(driver)/IDS(transfer) = Wd/Ld \times Lt/Wt$$

Therefore, according to the above expression, the width of the WL1 at the gate section of T1, that of the first gate electrode 22a at the gate section of T2, that of the second gate electrode 22b at the gate section of T4, that of the first active region 21a at each of the gate sections of T1 and T2, and that of the second active region 21b at each of the gate sections of T3 and T4 are adjusted so that the $\beta$ ratio of memory cells is kept at 3 to 4.

(b) Description of layout of connection section between first power-supply line Vss and bit line (hereinafter referred to as BL) and BL FIG. 3 is a top view of the layout of the connective section connecting the first power-supply line Vss and BL1, the connective section connecting the first power-supply line Vss and BL2, and BL1 and BL2. Moreover, the first active region 21a and second active region 21b are also shown in FIG. 3 as the standard pattern for specifying a positional relation.

In FIG. 3, symbols 23a and 23b are first and second BL connective sections made of a polycrystal silicon film respectively. One end of the first BL connective section 23a is connected with the terminating portion of the first active region 21a and the other end of it extends above T1 so that it can be connected with the first bit line BL1 arranged in a direction perpendicular to the wiring direction of the WL1. One end of the second BL connective section 23b is connected with the terminating portion of the second active region 21b and the other end of it extends above T3 so that it can be connected with the second bit line BL2 arranged in a direction perpendicular to the wiring direction of the WL1 and the BL1 and BL2 do not pass above other openings.

Symbol Vss is a first power-supply line formed at the approximately central region of a memory cell and made of a strip-shaped polycrystal silicon film extending in the wiring direction of the WL1. The first power-supply line Vss is connected with the S/D region of T2 and that of T4 through the openings 26a and 26b formed in the regions intersecting the first active region 21a and second active region 21b respectively.

The first BL connective section 23a, second BL connective section 23b, and first power-supply line Vss are obtained by patterning a polycrystal silicon film simultaneously formed.

The bit lines BL1 and BL2 are formed after patterning an aluminum film or the like.

(c) Description of layout of first load element T5, second load element T6, and power supply line Vcc FIG. 4 is a top view of the layout of the first load element T5, second load element T6, and second power-supply line Vcc. The first active region 21a and second active region 21b are also shown in FIG. 4 as the standard pattern for specifying a positional relation.

In FIG. 4, symbol 24a is a fourth gate electrode of the second load element (L2) connecting with the first gate electrode 22a and the drain of T2 of a lower layer. Symbol 24b is a third gate electrode of the first load element (L1) connecting with the second gate electrode 22b and the drain of T4 of a lower layer.

Each of the fourth gate electrode 24a and third gate electrode 24b has both a gate section serving as a gate electrode and a connective section. The gate sections of the fourth gate electrode 24a and the third electrode 24b are located above T2 and T4 respectively. The connective sections of the fourth gate electrode 24a and the third electrode 24b are located above the region between T1 and T2 and the region between T3 and T4 respectively.

Symbol Vcc1 is a strip-shaped first branch power-supply line (second power-supply line) extending in the wiring direction of the WL1, which is present above the WL1 and Vcc2 is a strip-shaped second branch power-supply line (third power-supply line) extending in the wiring direction of the WL1, which is present above the WL2.

The Vcc1 is shared with adjacent memory cells for common use and the Vcc2 is similar to the Vcc1. The Vcc1 and Vcc2 are connected each other in a not-illustrated region to serve as a second common power-supply line Vcc.

Symbol 25a is a first active layer made of a strip-shaped polycrystal silicon film, which passes above the gate section of the fourth gate electrode 24a in the state of putting an insulating film between them. A region above the fourth gate electrode 24a serves as a channel region and regions at the both sides of the channel region serve as S/D regions. And, one S/D region serving as a drain is connected with the Vcc1 and the other S/D region serving as a source is connected with the third gate electrode 24b and the drain of T2.

Symbol 25b is a second active layer made of a strip-shaped polycrystal silicon film, which passes above the gate section of the third gate electrode 24b in the state of putting an insulating film between them. A region above the third gate electrode 24b serves as a channel region serves as a channel region and regions at the both sides of the channel region serve as S/D regions. And, one S/D region serving as a drain is connected with the Vcc2 and the other S/D region serving as a source is connected with the fourth gate electrode 24a and the drain of T4. Moreover, the first active layer 25a and second active layer 25b bend correspondingly to the layout of the fourth gate electrode 24a and that of the third gate electrode 24 respectively.

For the above constitution, the fourth gate electrode 24a, third gate electrode 24b, Vcc1, and Vcc2 are obtained by pattering a polycrystal silicon film simultaneously formed. The first active layer 25a and second active layer 25b are obtained by patterning another polycrystal silicon film simultaneously formed on the fourth gate electrode 24a, third gate electrode 24b, Vcc1, and Vcc2.

For the above embodiment, the first load element T5 and second load element T6 each of which comprises an insulated gate field effect transistor are used as the first load L1 and second load L2 respectively. However, as shown in FIG. 6B, it is also possible to use the first load resistance R1 and second load resistance R2.

(d) Functions and advantages of embodiment of present invention

As described above, for the pattern layout of the memory cell of the SRAM of the above embodiment, the WL1 bends diagonally to the wiring direction at the gate section of T1, the WL2 bends diagonally to the wiring direction at the gate section of T3, and the first active region 21a and second active region 21b are arranged diagonally to the wiring direction of the WL1 and WL2 respectively.

Therefore, an width of each of the WL1 and WL2 along each direction in which each of the first active region 21a and second active region 21b extends corresponds to a channel length of each of T1 and T3. Accordingly, by increasing each of the widths of the WL1 and WL2, each of the channel lengths of T1 and T3 is increased.

In this case, because the WL1 and WL2 in the intersecting region are diagonally arranged, the WL1 and WL2 spread only in the wiring direction even if increasing the widths of the WL1 and WL2. Therefore, this does not affect the longitudinal dimension of a memory cell unlike the example according to the related art.

Therefore, it is possible to increase the channel length and secure a desired β ratio while keeping the area occupied by one memory cell approximately equally to the existing one.

Moreover, in the case of making a pattern fine, it is possible to secure a desired β ratio by decreasing the channel widths of T1 and T3 without decreasing the channel widths of T2 and T4 upon locally narrowing the first active region 21a and second active region 21b in the intersecting region in addition that increasing the channel length as describe above.

As shown in FIG. 3, the patterns of a memory cell are arranged so that they are point-symmetric around an axis vertical to the central portion of the memory cell. For example, it is simplified to form a point-symmetric pattern layout by arranging the first opening 26a and second opening 26b connecting the source of T2 and source of T4 with first power-supply line Vss respectively at the central portion of a memory cell and by laying the first power-supply line Vss in the wiring direction of the WL1 and WL2. Thereby, when making a memory cell pattern finer, the design is simplified.

Moreover, as shown in FIG. 4, it is possible to further advance the integration level by having each of the Vcc1 and Vcc2 for common use between adjacent memory cells.

Figure 6A:
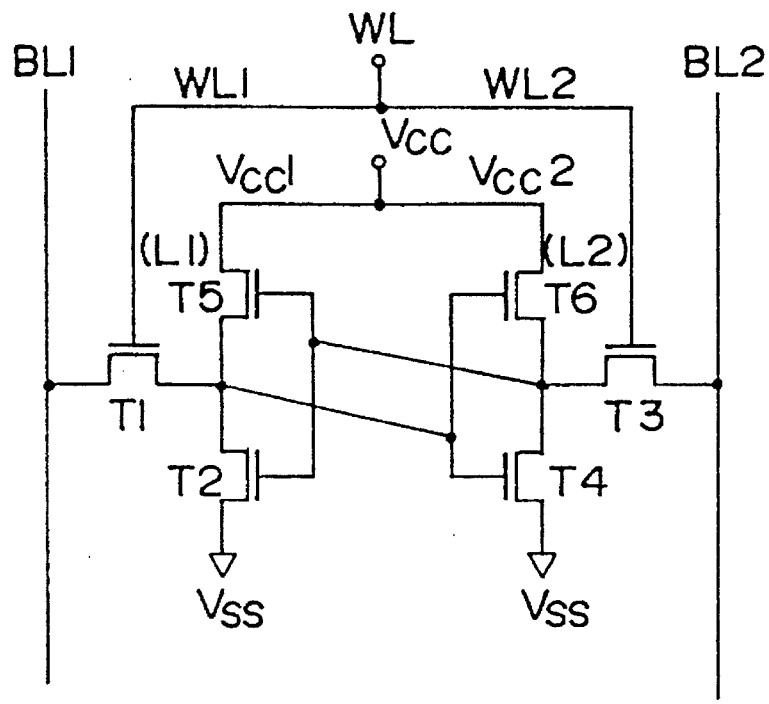
FIG. 6A shows a circuit block diagram of a memory cell of the SRAM of the embodiment of the present invention using a field effect transistor as first and second loads respectively.
Figure 6B:
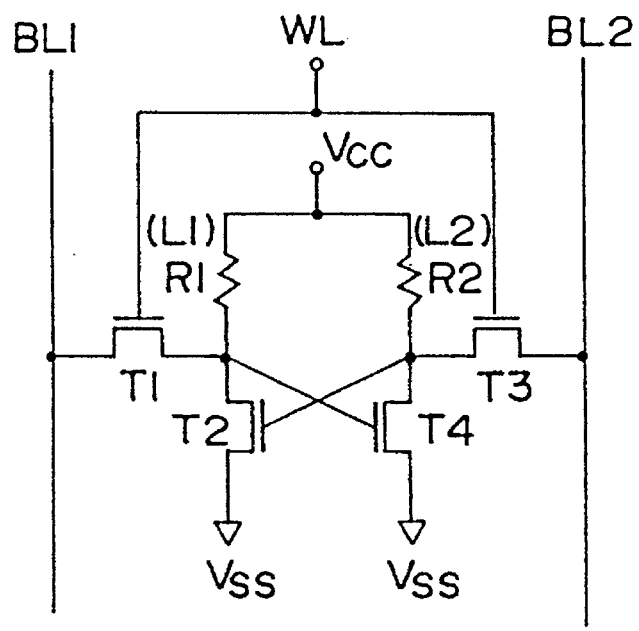
FIG. 6B shows a circuit block diagram of a memory cell of the SRAM of the embodiment of the present invention using a resistor as first and second loads respectively.

Furthermore, as shown in FIGS. 4 and 6A, by forming the bent first active layer 25a and second active layer 25b, the range for adjusting the channel length is widened and therefore, current can be controlled in a wide range. Thereby, when making a memory cell pattern finer, the design is simplified.

Furthermore, as shown in FIG. 6B, when the first load resistance R1 and second load resistance R2 are used as the first load L1 and second load L2 respectively, it is possible to increase the resistor length correspondingly to the area in which the first active layer 25a and second active layer 25b are occupied by bending the first load resistance R1 and second load resistance R2. Therefore, the range of adjustable load resistance values is widened and therefore, current can be controlled in a wide range. Thereby, when making a memory cell pattern finer, the design is simplified.

What is claimed is:

1. A semiconductor memory device having a memory cell comprising:

a word line extending in a definite direction on a semiconductor substrate, and having an aligned portion aligned with the definite direction and a bent portion bending with respect to the definite direction, the bent portion serving as a gate electrode of a first transistor and being wider than the aligned portion; and an active region serving as source/drain regions of the first transistor, the bent portion of the word line intersecting the active region between the source/drain regions.

2. A semiconductor memory device according to claim 1, wherein the active region extends to a second transistor region, has source/drain regions of a second transistor, and intersects the gate electrode of the second transistor which is formed between the source/drain regions of the second transistor, and a width of the active region vertical to an extending direction in the first transistor region is narrower than that in the second transistor region.

3. A semiconductor memory device having a memory cell comprising:

a first word line extending in a definite direction on a semiconductor substrate, and having an aligned portion aligned with the definite direction and a bent portion bending with respect to the definite direction, the bent portion of the first word line serving as a first gate electrode of a first transistor and being wider than the aligned portion of the first word line;

a second word line extending in the definite direction, parallel with and separate from the first word line, the second line having an aligned portion aligned with the definite direction and a bent portion bending with respect to the definite direction, the bent portion of the second word line serving as a second gate electrode of a third transistor and being wider than the, aligned portion of the second word line;

a strip-shaped first active region serving as source/drain regions of the first transistor, the bent portion of the first word line intersecting the first active region between the source/drain regions of the first transistor, the first active region extending from the first word line toward the second word line;

a strip-shaped second active region serving as source/drain regions of the third transistor, the bent portion of the second word line intersecting the second active region between the source/drain regions of the third transistor, the second active region extending from the second word line toward the first word line;

a third gate electrode intersecting the first active region at a second transistor region between the first and second word lines and extending from the first active region toward the second active region to contact the second active region; and a fourth gate electrode intersecting the second active region at a fourth transistor region between the first and second word lines and extending from the second active region toward the first active region to contact the first active region.

4. A semiconductor memory device according to claim 3, wherein the width of the first active region intersecting the first word line is smaller than the width of the first active region intersecting the first gate electrode and the width of the second active region intersecting the second word line is smaller than the width of the second active region intersecting the second gate electrode.

5. A semiconductor memory device according to claim 3, wherein a first power-supply line extends in a definite direction in the region between the first and second word lines and a first opening for connecting the source/drain region of the second transistor with the first power-supply line and a second opening for connecting the source/drain region of the fourth transistor with the first power-supply line are formed at the central portion of the memory cell.

6. A semiconductor memory device according to claim 5, wherein the memory cell is point-symmetric around an axis vertical to the central portion of the memory cell.

7. A semiconductor memory device according to claim 3, wherein:

a second power-supply line connected with the source/drain region of the second transistor through a first load and a third power-supply line connected with the source/drain region of the fourth resistor through a second load are used;

and each of the second and third power-supply lines are for common use between adjacent memory cells.

8. A semiconductor memory device according to claim 3, comprising:

a first load element comprising a field effect transistor connected to the second transistor, comprising:

a strip-shaped first active layer which bends in a region intersecting a fourth gate electrode, which defining a channel region in the intersecting regions and serving as source/drain regions on both sides of the channel region, and a second load element, comprising a field effect transistor connected to the fourth transistor region, said second load element comprising:

a strip-shaped second active layer which bends in a region intersecting a third gate electrode, defining a channel region in the intersecting region and serving as source/drain regions on both sides of the channel region.

9. A semiconductor memory device according to claim 3, wherein:

a first resistor connected to the source/drain region of the second transistor and a second resistor connected to the source/drain region of the fourth transistor are used; and each of the first and second resistors is formed on an insulating film on a semiconductor substrate and bends.

10. A semiconductor memory device according to claim 3, wherein the first and third transistors are transfer transistors, the second and fourth transistors are driver transistors, and the memory cell is an SRAM memory cell.

* * * * *